(12) United States Patent
Song (10) Patent No.: US 10,816,594 B2
(45) Date of Patent: Oct. 27, 2020

(54) APPARATUS FOR TESTING A SIGNAL SPEED OF A SEMICONDUCTOR PACKAGE AND METHOD OF MANUFACTURING A SEMICONDUCTOR PACKAGE

(71) Applicant: Samsung Electronics Co., Ltd., Suwon-si (KR)

(72) Inventor: Ki-Jae Song, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 224 days.

(21) Appl. No.: 16/046,015

(22) Filed: Jul. 26, 2018

(65) Prior Publication Data

US 2019/0162776 A1    May 30, 2019

(30) Foreign Application Priority Data

Nov. 27, 2017  (KR) ........................ 10-2017-0159673

(51) Int. Cl.
*G01R 31/28* (2006.01)
*H01L 21/66* (2006.01)

(52) U.S. Cl.
CPC ..... *G01R 31/2863* (2013.01); *G01R 31/2896* (2013.01); *H01L 22/14* (2013.01)

(58) Field of Classification Search
CPC . G01R 31/2863; G01R 31/2896; H01L 22/14; H01L 23/544; H01L 23/66
USPC ...... 324/500, 756.01–758.01, 762.02, 76.11, 324/106, 757.04, 754.01–754.07, 690, 324/696, 715, 724
See application file for complete search history.

(56) References Cited

U.S. PATENT DOCUMENTS

| | | | |
|---|---|---|---|
| 6,313,653 B1 * | 11/2001 | Takahashi | G01R 31/2863 324/750.03 |
| 7,598,760 B1 | 10/2009 | Bensing et al. | |
| 7,786,721 B2 | 8/2010 | Kim et al. | |
| 8,986,048 B2 | 3/2015 | Hendrickson et al. | |

(Continued)

FOREIGN PATENT DOCUMENTS

| | | |
|---|---|---|
| JP | 2015001430 A | 1/2015 |
| KR | 10-0816796 B1 | 3/2008 |

(Continued)

*Primary Examiner* — Vincent Q Nguyen
*Assistant Examiner* — Trung Nguyen
(74) *Attorney, Agent, or Firm* — Muir Patent Law, PLLC (57) ABSTRACT

An apparatus for testing a signal speed of a semiconductor package may include a plurality of sockets, one or more test boards including at least a first test board, an extension board and a test head. Each of the sockets may be configured to receive the semiconductor package. The first test board may include a plurality of mount regions on which the sockets may be mounted, and test lines extended from the mount regions toward at least one side surface of the first test board. The extension board may be vertically arranged at the side surface of the first test board. The extension board may be electrically connected to the test lines. The test head may be electrically connected to the extension board to provide the mount regions with a test signal for testing the signal speed of the semiconductor package through the extension board. Thus, it may not be required to change a structure of the socket in accordance with types of the semiconductor packages.

17 Claims, 5 Drawing Sheets

(56) References Cited

U.S. PATENT DOCUMENTS

| | | | |
|---|---|---|---|
| 9,128,147 B2 | 9/2015 | Makita et al. | |
| 9,620,243 B2 | 4/2017 | Park | |
| 9,711,389 B2 | 7/2017 | Kim et al. | |
| 2004/0223309 A1* | 11/2004 | Haemer | G01R 1/07314 |
| | | | 361/767 |
| 2007/0184680 A1 | 8/2007 | Choi et al. | |
| 2017/0312378 A1 | 11/2017 | Goncalves | |

FOREIGN PATENT DOCUMENTS

| | | |
|---|---|---|
| KR | 10-2008-0064250 A | 7/2008 |
| KR | 10-1332656 B1 | 11/2013 |
| KR | 10-2015-0032430 A | 3/2015 |
| KR | 10-2016-0094124 A | 8/2016 |
| KR | 10-2017-0076702 | 7/2017 |

* cited by examiner

APPARATUS FOR TESTING A SIGNAL SPEED OF A SEMICONDUCTOR PACKAGE AND METHOD OF MANUFACTURING A SEMICONDUCTOR PACKAGE

CROSS-RELATED APPLICATION

This application claims priority under 35 USC § 119 to Korean Patent Application No. 10-2017-0159673, filed on Nov. 27, 2017 in the Korean Intellectual Property Office (KIPO), the contents of which are herein incorporated by reference in their entirety.

BACKGROUND

1. Field

Example embodiments relate to an apparatus for testing a signal speed of a semiconductor package.

2. Description of the Related Art

Generally, an apparatus for testing a semiconductor package may be classified into a burn-in test apparatus and a signal speed test apparatus. The burn-in test apparatus may be configured to test heat-resisting property of the semiconductor package. The signal speed test apparatus may be configured to test a signal speed of the semiconductor package.

According to related art, the signal speed test apparatus may include a pusher, an insert, a guide, a socket, a test board and a test head. The pusher, the insert, the guide and the socket may have functions for coupling the semiconductor package to the test board. When the semiconductor package is replaced with a new semiconductor package to perform a test on the new semiconductor package, it may be required to replace (or change the structure of) the socket, the insert, and the guide with a new socket, a new insert, and a new guide corresponding to the new semiconductor package.

Further, the test head may be arranged under the test board. Thus, the signal speed test apparatus may be configured to test only the semiconductor packages arranged on one test board.

SUMMARY

Example embodiments provide an apparatus for testing a signal speed of a semiconductor package that may be capable of testing a plurality of semiconductor packages on a corresponding test board among a plurality of test boards without replacing any parts of the apparatus regardless of different types of the semiconductor packages to be tested.

According to example embodiments, there may be provided an apparatus for testing a signal speed of a semiconductor package. The apparatus may include a plurality of sockets each configured to receive the semiconductor package; one or more test boards including at least a first test board including a plurality of mount regions each configured to receive a corresponding socket among the plurality of the sockets, and test lines extended from the mount regions toward at least one side surface of the mount regions; and a test head electrically connected to the test lines of the first test board to provide the mount regions with a test signal for testing the signal speed of the semiconductor package through the test lines.

According to example embodiments, there may be provided an apparatus for testing a signal speed of a semiconductor package. The apparatus may include a plurality of sockets each including a latch configured to fix the semiconductor package; one or more test boards including at least a first test board including a plurality of mount regions configured to receive the sockets, and test lines extended from the mount regions toward at least one side surface of the mount regions; an extension board vertically arranged at the side surface of the first test board and electrically connected to the test lines; and a test head electrically connected to the extension board to provide the mount regions with a test signal for testing the signal speed of the semiconductor package through the extension board.

According to example embodiments, there may be provided an apparatus for testing a signal speed of a semiconductor package. The apparatus may include a plurality of sockets each including a latch configured to fix the semiconductor package; a plurality of test boards including a plurality of mount regions configured to receive the sockets, and test lines extended from the mount regions toward at least one side surface of the mount regions; connectors arranged at the side surfaces of the test boards and connected to the test board to the test lines; an extension board vertically arranged at the side surface of each of the test boards and electrically connected to the connectors; a test head electrically connected to the extension board to provide the mount regions with a test signal for testing the signal speed of the semiconductor package through the extension board; and a coupling member configured to selectively connect the extension board to the test head.

According to example embodiments, because the socket may be configured to fix the semiconductor package using a latch, it may not be required to change a structure of the socket in accordance with types of the semiconductor packages. Thus, it may also not be required to change the test board configured to receive the sockets in accordance with the types of the semiconductor packages. Further, because the test boards may be connected to the vertically arranged extension board, the signal test may be performed on the semiconductor package on the test boards.

BRIEF DESCRIPTION OF THE DRAWINGS

Example embodiments will be more clearly understood from the following detailed description taken in conjunction with the accompanying drawings. FIGS. 1 to 6 represent non-limiting, example embodiments as described herein.

DETAILED DESCRIPTION

Hereinafter, example embodiments will be explained in detail with reference to the accompanying drawings.

Figure 1:
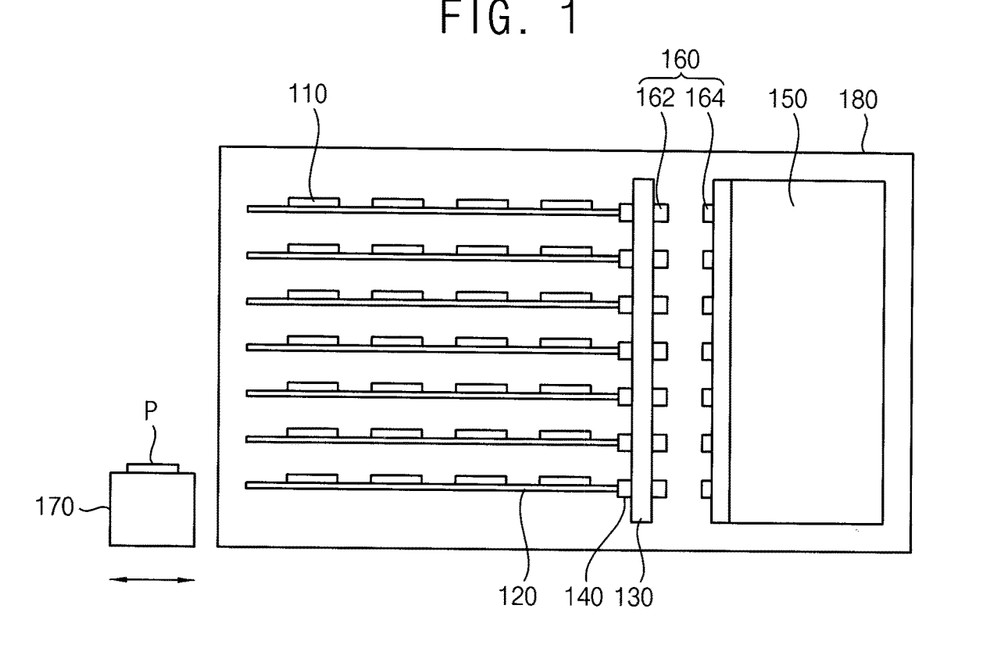
FIG. 1 is a cross-sectional view illustrating an apparatus for testing a signal speed of a semiconductor package in accordance with example embodiments.
Figure 2:
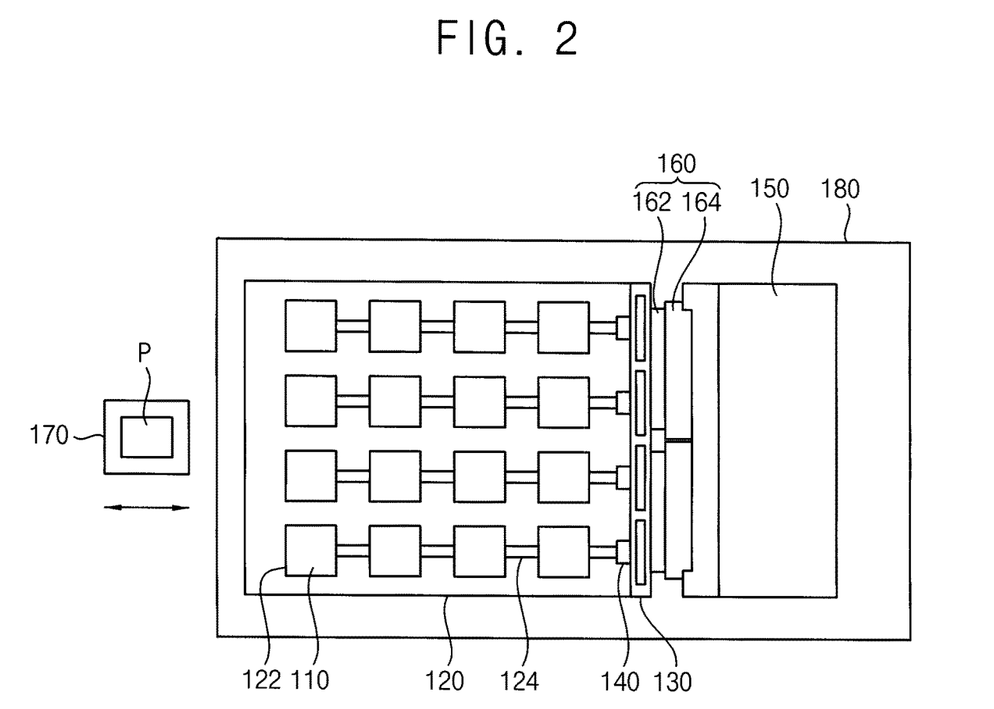
FIG. 2 is a plan view illustrating the apparatus in FIG. 1.

FIG. 1 is a cross-sectional view illustrating an apparatus for testing a signal speed of a semiconductor package in accordance with example embodiments, and FIG. 2 is a plan view illustrating the apparatus in FIG. 1.

Referring to FIGS. 1 and 2, an apparatus for testing a signal speed of a semiconductor package P in accordance with this example embodiment may include a test chamber 180, a plurality of sockets 110, a plurality of test boards 120, an extension board 130, connectors 140, a test head 150, a coupling member 160 and a transferring unit 170.

According to exemplary embodiments, the semiconductor package P may be a semiconductor chip package selected from the group consisting of a TSOP (Thin Small Outline Package), a BGAP (Ball Grid Array Package), a DIP (Dual Inline Package), a QFP (Quad Flat Package), and a CSP (Chip Scale Package) may be inserted into the plurality of sockets 110.

The sockets 110 may be mounted on an upper surface of each of the test boards 120. The sockets 110 mounted on a corresponding test board 120 may be spaced apart from each other in a horizontal direction by a uniform gap. The test boards 120 may be horizontally arranged (e.g., along a horizontal plane) and may be spaced apart from each other in a vertical direction by a uniform gap in the test chamber 180.

The extension board 130 may be vertically arranged at side surfaces (e.g., edges) of the test boards 120. The side surfaces of the test boards 120 may be connected to the extension board 130. The connectors 140 may be configured to connect the test boards 120 with the extension board 130. According to example embodiments, one end of each test board 120 adjacent to the extension board 130 may be connected to the extension board 130 via a corresponding connector 140.

The test head 150 may be arranged at a side surface of the extension board 130 opposite the side surface of the extension board 130 at which the test boards 120 are connected to the extension board 130. The test head 150 may be arranged in the test chamber 180. The test head 150 may be configured to generate a test signal for testing the signal speed of the semiconductor package P.

The coupling member 160 may be configured to selectively connect the extension board 130 with the test head 150. The coupling member 160 may include a first coupler 162 installed at the extension board 130, and a second coupler 164 installed at the test head 150. The second coupler 164 may be detachably inserted into the first coupler 162.

The transferring unit 170 may be configured to load the test boards 120 with the sockets 110, the extension board 130 connected to the test boards 120 and the first coupler 162 installed at the extension board 130 into the test chamber 180. The test boards 120 may be electrically connected to the test head 150 by connecting the second coupler 164 with the first coupler 162. The transferring unit 170 may include an automated guided vehicle (AGV).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component.

When a signal speed test is completed, the first coupler 162 may be disassembled from the second coupler 164. The transferring unit 170 may unload the test boards 120 with the sockets 110, the extension board 130 connected to the test boards 120 and the first coupler 162 installed at the extension board 130 from the test chamber 180 to a sorting unit (not shown). The sorting unit may be configured to classify the semiconductor packages P into normal semiconductor packages and abnormal semiconductor packages depending on the test results.

Figure 3:
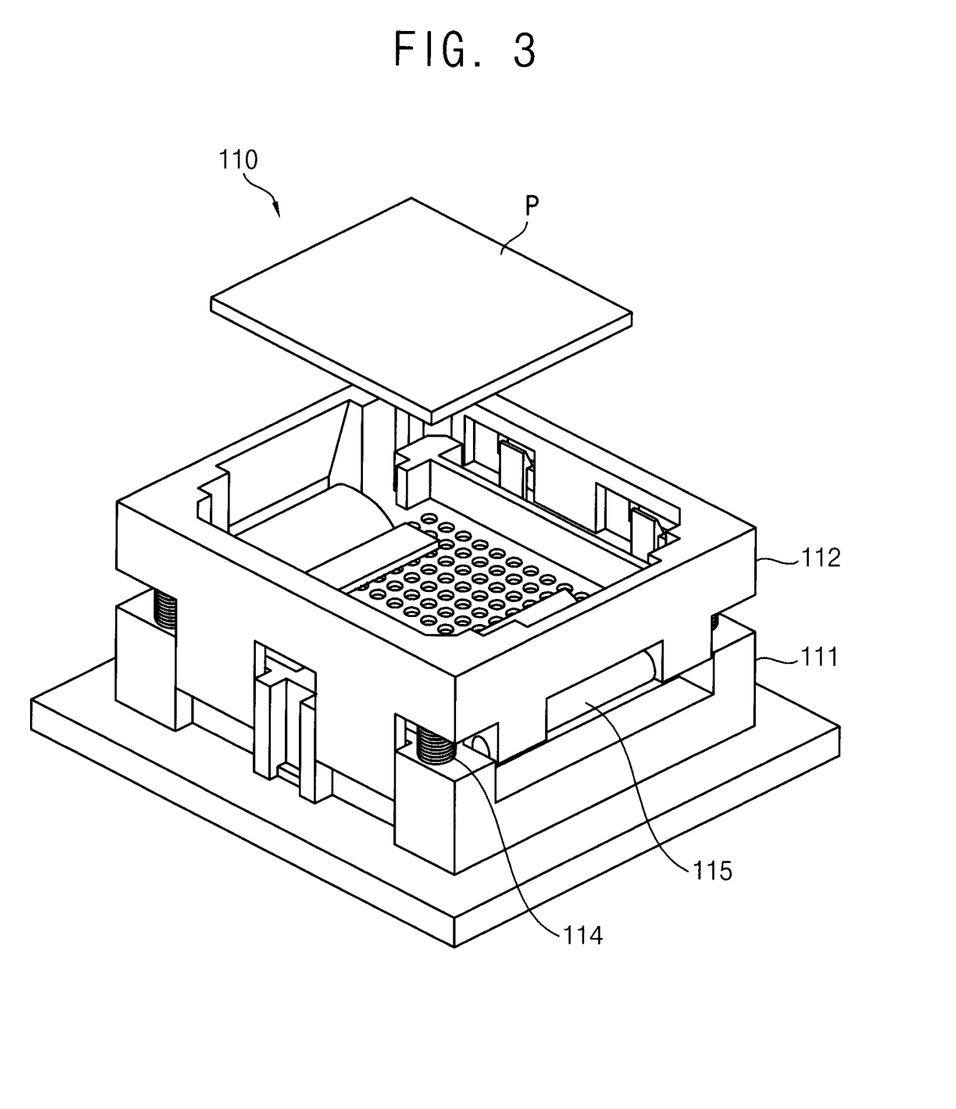
FIG. 3 is an exploded perspective view illustrating a socket of the apparatus in FIG. 1.
Figure 4:
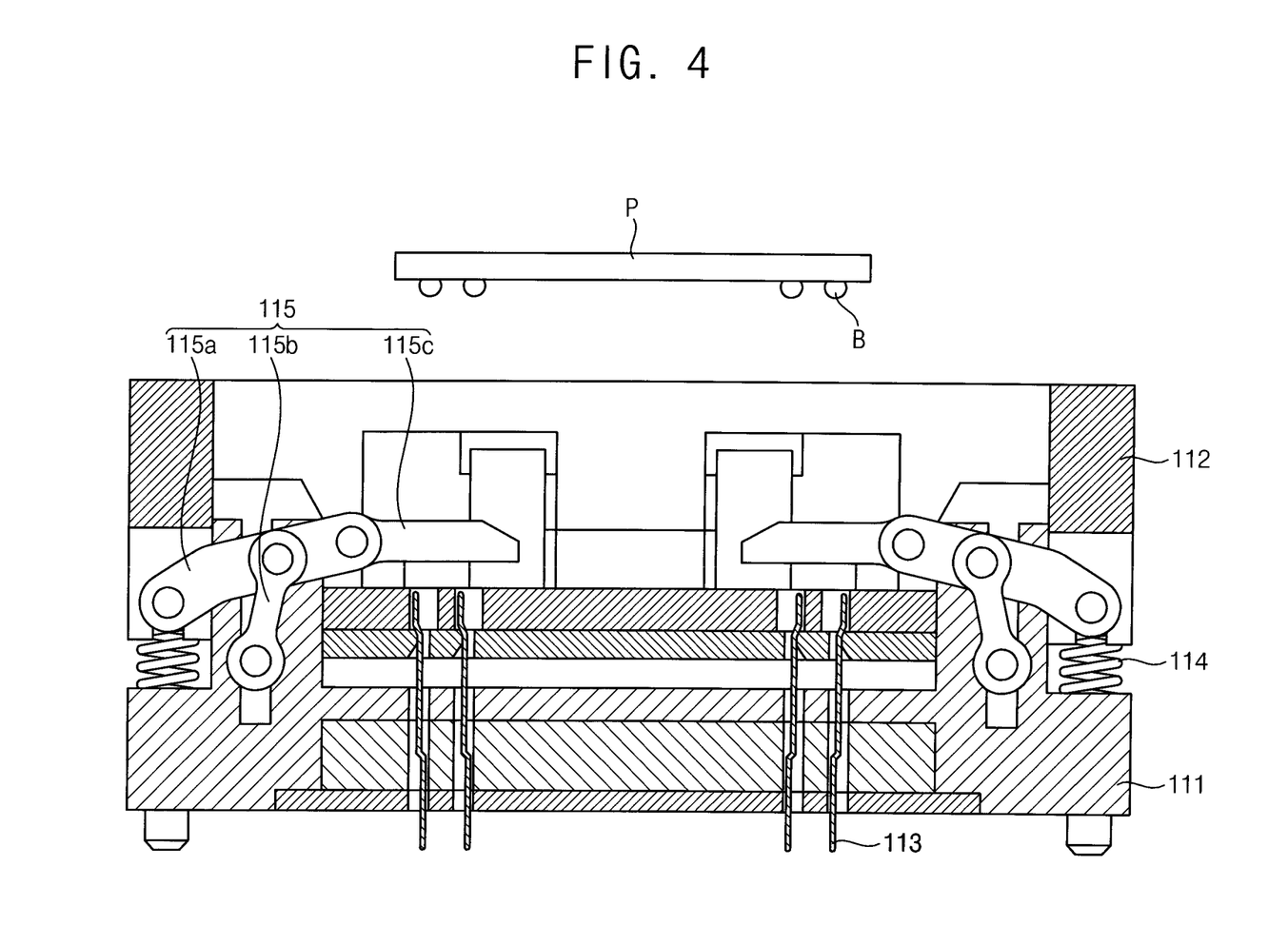
FIG. 4 is a cross-sectional view illustrating the socket in FIG. 3.

FIG. 3 is an exploded perspective view illustrating a socket of the apparatus in FIG. 1, and FIG. 4 is a cross-sectional view illustrating the socket in FIG. 3.

Referring to FIGS. 3 and 4, the socket 110 may include a base 111, a cover 112, a plurality of socket pins 113, springs 114 and a latch 115.

The base 111 may have an inner space configured to receive the semiconductor package P. The base 111 may be mounted on the test board 120. The base 111 may have a rectangular parallelepiped shape, but the disclosure is not limited thereto.

The cover 112 may be arranged over the base 111. The cover 112 may have a rectangular parallelepiped shape corresponding to the rectangular parallelepiped shape of the base 111. The cover 112 may be selectively combined with an upper surface of the base 111 to form a receiving space configured to receive the semiconductor package P.

The socket pins 113 may be arranged on a lower surface of the base 111. The socket pins 113 may have upper ends connected to external terminals B of the semiconductor package P in the base 111. The socket pins 113 may have lower ends electrically connected to the test board 120.

The springs 114 may be connected between the base 111 and the cover 112. The springs 114 may include four springs connected between corners of the base 111 and corresponding corners of the cover 112. Thus, when the cover 112 may be downwardly moved toward the base 111, the springs 114 may be compressed.

The latch 115 may be configured to fix the semiconductor package P in the base 111 together with the springs 114. The latch 115 may include a rotating link 115a, a supporting link 115b and a fixing link 115c. The "link(s)" described herein may be generally referred to as "member(s)."

The rotating link 115a may have a first end connected to the spring 114, and a second end extended from the first end toward the upper surface of the base 111 in an inward direction. The supporting link 115b may have a first end rotatably connected to the base 111, and a second end configured to rotatably support a middle portion of the rotating link 115a. Thus, the rotating link 115a may be rotated with respect to the middle portion of the rotating link 115a rotatably supported by the second end of the supporting link 115b.

The fixing link 115c may be connected to the second end of the rotating link 115a. The fixing link 115c may pressurize an upper surface of the semiconductor package P in the base 111 to fix the semiconductor package P and prevent movement during testing.

When the cover 112 may be downwardly moved to the base 111, the cover 112 may compress the springs 114. Thus, the first end of the rotating link 115a may be downwardly moved so that the second end of the rotating link 115a may be upwardly moved. The fixing link 115c may also be upwardly moved to open the inner space of the base 111. The semiconductor package P may be received in the inner space of the base 111. The external terminals B of the semiconductor package P may electrically make contact with the socket pins 113.

When the downward force applied to the cover 112 may be removed, the first end of the rotating link 115a may be upwardly moved by restoring forces of the springs 114 so that the second end of the rotating link 115a may be downwardly moved. Thus, the fixing link 115c may be downwardly moved so that the fixing link 115c may pressurize the upper surface of the semiconductor package P in the base 111.

According to example embodiments, the socket 110 may fix the semiconductor package P using the latch 115. Thus, it may not be required to change the structure of the socket 110 or replace the socket 110 with a new socket in accordance with types of the semiconductor packages P to be tested.

Referring to FIG. 2, each of the test board 120 may have a rectangular parallelepiped shape. Thus, the test board 120 may have a first side surface, a second side surface opposite to the first side surface, a third side surface substantially perpendicular to the first side surface, and a fourth side surface opposite to the third side surface. Each of the test boards 120 may include a plurality of mount regions 122 and a plurality of test lines 124.

The mount regions 122 may be formed on the upper surface of the test board 120. The mount regions 122 may be arranged in lengthwise and breadthwise directions by a uniform gap. Each socket 110 may be mounted on a corresponding mount region 122. For example, the socket pins 113 of each of the sockets 110 may electrically connect to each of the mount regions 122.

The test lines 124 (also referred to as first test lines) may be extended from the mount regions 122 toward the first side surface of the test board 120. The connectors 140 may be arranged at the first side surface of the test board 120. The connectors 140 may be electrically connected to the test lines 124. Thus, the test signal generated by the test head 150 may pass through the test lines for testing the signal speed of the semiconductor package P.

In example embodiments, because the socket 110 may not be replaced with a new socket in accordance with the types of the semiconductor packages P to be tested, it may also not be required to replace the test board on which the socket 110 may be mounted in accordance with the types of the semiconductor packages P to be tested. Thus, the signal speed test of the various types of the semiconductor packages P may use only one test board 120.

The extension board 130 may be installed at the first side surface of the test board 120. The extension board 130 may be vertically arranged so that the extension board 130 may be substantially perpendicular to the test board 120. The extension board 130 may be electrically connected to the test lines 124 through the connectors 140.

The test head 150 may be arranged at the right side the extension board 130 (the side of the extension board 130 where the first couplers 162 are arranged). As mentioned above, the test head 150 may be selectively connected to the extension board 130 by the coupling member 160. Thus, the test signal generated from the test head 150 may be transmitted to the mount regions 122 through the coupling member 160, the extension board 130, the connector 140 and the test lines 124.

Hereinafter, a method of testing the signal speed of the semiconductor package using the apparatus in FIG. 1 is illustrated in detail.

The cover 112 may be downwardly moved to the base 111. The cover 112 may compress the springs 114. The first end of the rotating link 115a may be downwardly moved so that the second end of the rotating link 115a may be upwardly moved. The fixing link 115c may also be upwardly moved to open the inner space of the base 111. The semiconductor package P may be received in the inner space of the base 111. The external terminals B of the semiconductor package P may contact and electrically connect to the socket pins 113.

When the downward force applied to the cover 112 is removed, the first end of the rotating link 115a may be upwardly moved by restoring forces of the springs 114 so that the second end of the rotating link 115a may be downwardly moved. Thus, the fixing link 115c may be downwardly moved so that the fixing link 115c may pressurize the upper surface of the semiconductor package P in the base 111.

The sockets 110 may be mounted on the mount regions 122 of the test board 120. The socket pins 113 may contact and electrically connect to the mount regions 122. The connectors 140 of the test boards 120 with the sockets 110 may be connected to the extension board 130.

The transferring unit 170 may load the extension board 130 with the test boards 120 into the test chamber 180. The first coupler 162 installed at the extension board 130 may be connected to the second coupler 164 installed at the test head 150.

The test signal generated from the test head 150 may be transmitted to the semiconductor package P through the second coupler 164, the first coupler 162, the extension board 130, the connector 140, the test line 124 and the socket pins 113 to test the signal speed of the semiconductor package P.

After testing the signal speed of the semiconductor package P, the first coupler 162 may be disassembled (decoupled) from the second coupler 164. The transferring unit 170 may unload the extension board 130 with the test boards 120 from the test chamber 180.

The transferring unit 170 may transfer the extension board 130 with the test board 120 to the sorting unit. The sorting unit may classify the semiconductor packages P on the test boards 120 into the normal semiconductor packages and the abnormal semiconductor packages based on the test results.

Figure 5:
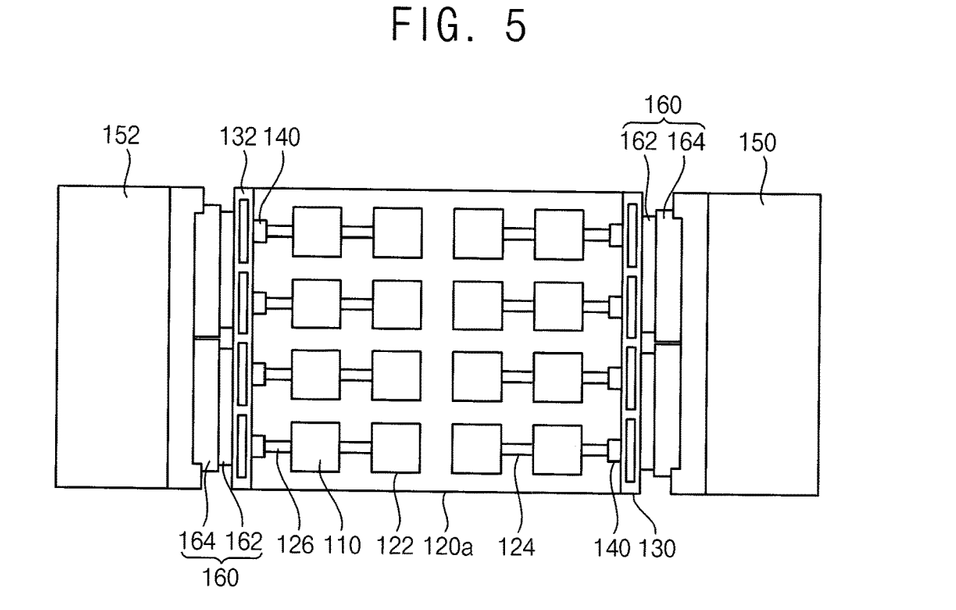
FIG. 5 is a plan view illustrating an apparatus for testing a signal speed of a semiconductor package in accordance with example embodiments.

FIG. 5 is a plan view illustrating an apparatus for testing a signal speed of a semiconductor package in accordance with example embodiments.

An apparatus for testing a signal speed of a semiconductor package in accordance with this example embodiment may include elements substantially the same as the apparatus in FIG. 2 except for a test board. Thus, the same reference numerals may refer to the same elements and any further illustrations with respect to the same elements may be omitted herein for brevity.

Referring to FIG. 5, a test board 120a of this example embodiment may include mount regions 122, first test lines 124 and second test lines 126. According to example embodiments, a set of mount regions 122 may be arranged at right side surface of the test board 120*a* and a set of mount regions 122 may be arranged at left side surface of the test board 120*a*. The right side surface of the test board 120*a* may also be referred to as the first side surface of the test board 120*a* and the left side surface of the test board 120*a* may also be referred to as the second side surface of the test board 120*a*.

The first test lines 124 may be extended from the first side surface of the test board 120*a* from right mount regions among the mount regions 122.

The second test lines 126 may be extended from the second side surface of the test board 120*a* from left mount regions among the mount regions 122. As mentioned above, the second side surface may be opposite to the first side surface. Thus, the second side surface may be substantially parallel to the first side surface.

Therefore, a first extension board 130 may be installed at the first side surface of the test board 120*a*. A second extension board 132 may be installed at the second side surface of the test board 120*a*. The second extension board 132 may be substantially parallel to the first extension board.

Further, a first test head 150 may be arranged at the side surface of the first extension board 130. The first test head 150 may be selectively connected to the first extension board 130 through the coupling member 160.

A second test head 152 may be arranged at the side surface of the second extension board 132. The second test head 152 may be selectively connected to the second extension board 132 through the coupling member 160. Thus, the second test head 152 may be substantially parallel to the first test head 150.

Alternatively, one test head 150 may be connected to the first and second extension boards 130 and 132 through the coupling member 160.

Figure 6:
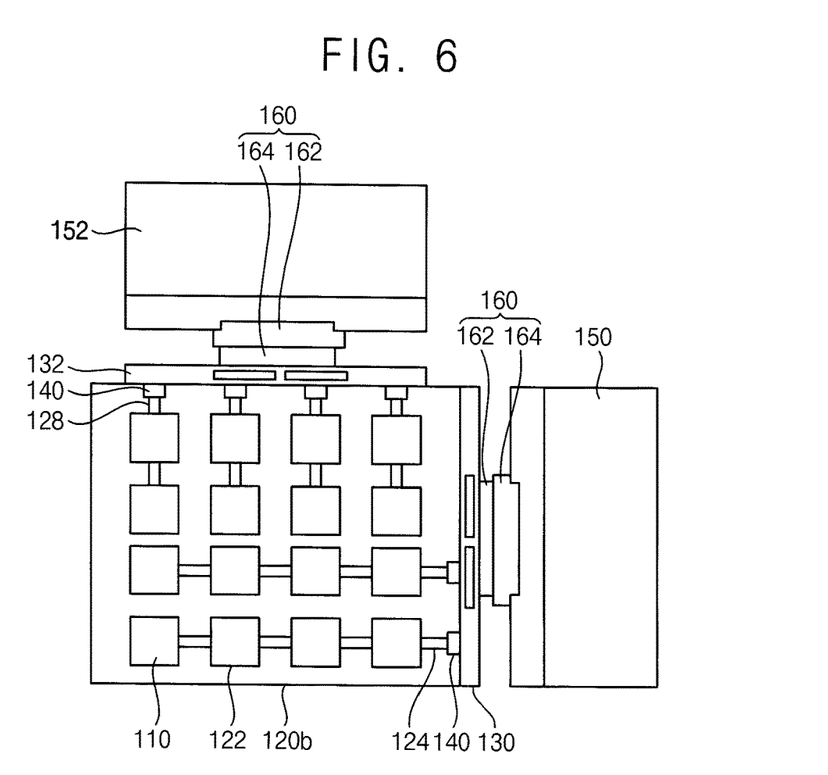
FIG. 6 is a plan view illustrating an apparatus for testing a signal speed of a semiconductor package in accordance with example embodiments.

FIG. 6 is a plan view illustrating an apparatus for testing a signal speed of a semiconductor package in accordance with example embodiments.

An apparatus for testing a signal speed of a semiconductor package in accordance with this example embodiment may include elements substantially the same as the apparatus in FIG. 5 except for a test board. Thus, the same reference numerals may refer to the same elements and any further illustrations with respect to the same elements may be omitted herein for brevity.

Referring to FIG. 6, a test board 120*b* of this example embodiment may include mount regions 122, first test lines 124 and second test lines 128. According to example embodiments, a set of mount regions 122 may be arranged at upper side surface of the test board 120*b* and a set of mount regions 122 may be arranged at lower side surface of the test board 120*b*. The upper side surface of the test board 120*b* may also be referred to as the third side surface of the test board 120*b* and the lower side surface of the test board 120*b* may also be referred to as the fourth side surface of the test board 120*b*.

The first test lines 124 may be extended from the first side surface of the test board 120*b* from lower mount regions among the mount regions 122.

The second test lines 128 may be extended from the third side surface of the test board 120*b* from upper mount regions among the mount regions 122. As mentioned above, the second side surface may be opposite to the first side surface. Thus, the third side surface may be substantially perpendicular to the first side surface.

Therefore, the first extension board 130 may be installed at the first side surface of the test board 120*b*. The second extension board 132 may be installed at the third side surface of the test board 120*b*. The second extension board 132 may be substantially perpendicular to the first extension board.

Further, the first test head 150 may be arranged at the side surface of the first extension board 130. The first test head 150 may be selectively connected to the first extension board 130 through the coupling member 160.

The second test head 152 may be arranged at the side surface of the second extension board 132. The second test head 152 may be selectively connected to the second extension board 132 through the coupling member 160. Thus, the second test head 152 may be substantially perpendicular to the first test head 150.

Alternatively, one test head 150 may be connected to the first and second extension boards 130 and 132 through the coupling member 160.

Figure 7:
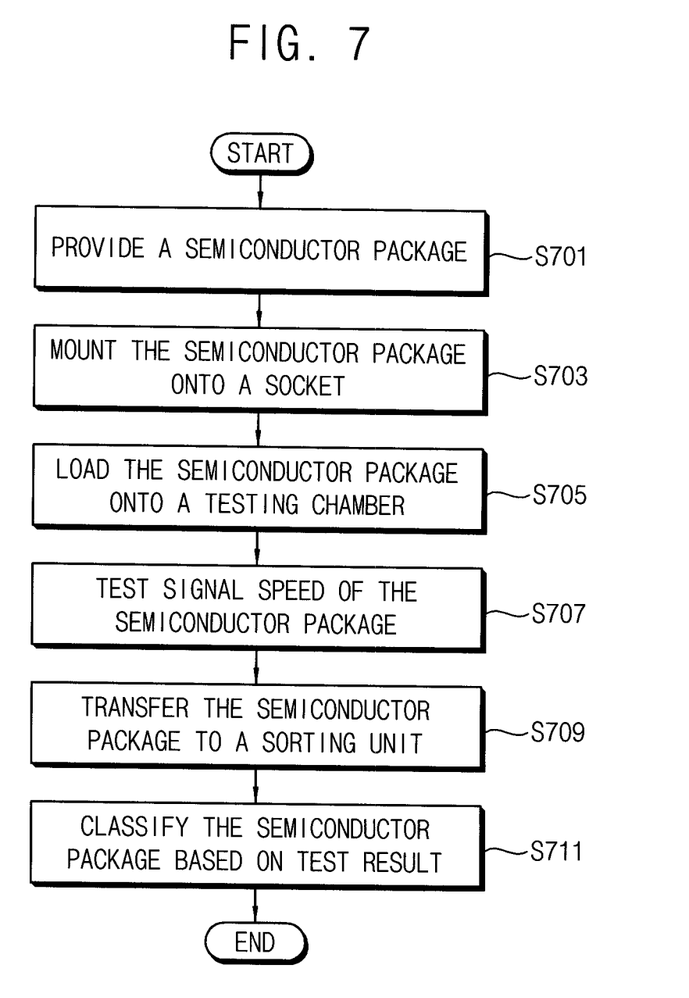
FIG. 7 is flow chart showing a method of manufacturing a semiconductor package in accordance with exemplar embodiments.

FIG. 7 is flow chart showing a method of manufacturing a semiconductor package in accordance with exemplary embodiments.

In step S701, a semiconductor package is provided. The semiconductor package may be a semiconductor package P according to the exemplary embodiments as disclosed above.

In step S703, the semiconductor package P is mounted onto a socket. The socket may be the socket 110 according to the exemplary embodiments as disclosed above. The socket 110 may include a base 111, a cover 112, a plurality of socket pins 113, springs 114 and a latch 115. The semiconductor package P is received in an inner space of the base 111. The socket 110 is configured to fix the semiconductor package P in the inner space of the base 111 using the latch 115. External terminals B of the semiconductor package P contact and electrically connect to the socket pins 113. The base 111 is mounted on the test board 120, 120*a* and 120*b*, and the test board 120, 120*a* and 120*b* is connected to the extension board 130 and 132.

In step S705, the semiconductor package P is loaded onto a testing chamber. The testing chamber may be the testing chamber 180 according to the exemplary embodiments as disclosed above. Test head 150, 152 is arranged in the test chamber 180. The test head 150, 152 is configured to generate a test signal for testing the signal speed of the semiconductor package P. A coupling member 160 may be configured to selectively connect the extension board 130, 132 to the test head 150, 152. The coupling member 160 may include a first coupler 162 installed at the extension board 130, 132, and a second coupler 164 installed at the test head 150, 152. The second coupler 164 is detachably inserted into the first coupler 162. A transferring unit 170 is configured to load the test board 120, 120*a*, 120*b* with the socket 110 having the semiconductor package P mounted thereon, the extension board 130, 132 connected to the test board 120, 120*a*, 120*b* and the first coupler 162 installed at the extension board 130, 132 into the test chamber 180. The test board 120, 120*a*, 120*b* contacts and electrically connects to the test head 150, 152 by connecting the second coupler 164 with the first coupler 162. The transferring unit 170 may include an automated guided vehicle (AGV).

In step S707, signal speed of the semiconductor package P is tested. The test signal generated from the test head 150, 152 is transmitted to the semiconductor package P through the second coupler 164, the first coupler 162, the extension board 130, 132, the connector 140, the test line 124, 126 and the socket pins 113 to test the signal speed of the semiconductor package P.

In step S709, the semiconductor package P is transferred via the transferring unit 170 to a sorting unit after completing the signal test.

In step S711, the sorting unit classifies the semiconductor package P into normal semiconductor package or abnormal semiconductor package based on the test result.

According to example embodiments, because the socket may be configured to fix the semiconductor package using a latch, it may not be required to change a structure of the socket or replace the socket with a new socket in accordance with types of the semiconductor packages to be tested. Thus, it may also not be required to change the structure of the test board or replace the test board with a new test board configured to receive the sockets in accordance with the types of the semiconductor packages to be tested. Further, because the test boards may be connected to the vertically arranged extension board, the signal test may be performed on the semiconductor package on the test boards.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for testing a signal speed of a semiconductor package, the apparatus comprising:
   a plurality of sockets each configured to receive the semiconductor package;
   two or more test boards vertically stacked on each other and including at least a first test board,
   wherein the first test board includes a plurality of mount regions each configured to receive a corresponding socket among the plurality of the sockets, and test lines extended between two adjacent mount regions of the mount regions;
   an extension board including a vertically-extending surface,
   wherein the vertically-extending surface of the extension board is attached to a side surface of each of the two or more test boards, and
   wherein the extension board is electrically connected to the test lines; and
   a test head electrically connected, via the extension board, to the test lines of the first test board to provide the mount regions with a test signal for testing the signal speed of the semiconductor package through the test lines.

2. The apparatus of claim 1, wherein each of the sockets comprises:
   a base mounted on a corresponding mount region of the mount regions to receive the semiconductor package;
   a plurality of socket pins arranged on the base to electrically connect the corresponding mount regions with the semiconductor package;
   a cover arranged over the base;
   at least one spring configured to connect the cover with the base; and
   a latch configured to fix the semiconductor package together with the spring in an inner space of the base.

3. The apparatus of claim 2, wherein the latch comprises:
   a rotating link connected to the spring;
   a supporting link configured to rotatably support the rotating link; and
   a fixing link connected to the rotating link to fix the semiconductor package in the inner space of the base.

4. The apparatus of claim 2, wherein the spring is arranged between corners of the cover and corners of the base.

5. The apparatus of claim 1, wherein the test lines are extended toward opposite two side surfaces of the first test board.

6. The apparatus of claim 1, wherein the test lines are extended toward two side surfaces of the first test board substantially perpendicular to each other.

7. The apparatus of claim 1, further comprising connectors arranged at the side surface of the first test board to connect the extension board with the test lines.

8. The apparatus of claim 1, further comprising a coupling member configured to selectively connect the extension board to the test head.

9. The apparatus of claim 8, wherein the coupling member comprises:
   a first coupler installed at the extension board; and
   a second coupler installed at the test head and detachably inserted into the first coupler.

10. The apparatus of claim 9, further comprising a transferring unit configured to transfer the extension board, the first test board connected to the extension board, the sockets mounted on the first test board and the first coupler installed at the extension board.

11. An apparatus for testing a signal speed of a semiconductor package, the apparatus comprising:
    a plurality of first sockets each including a latch configured to fix the semiconductor package;
    two or more test boards vertically stacked on each other and including at least a first test board,
    wherein the first test board includes a plurality of first mount regions configured to receive the first sockets, and first test lines extended between to adjacent mount regions of the plurality of first mount regions;
    a first extension board including a vertically extending surface,
    wherein the vertically-extending surface is attached to a first side surface of each of the two or more test boards, and
    wherein the first extension board is electrically connected to the first test lines; and
    a test head electrically connected to the first extension board to provide the first mount regions with a test signal for testing the signal speed of the semiconductor package through the first extension board.

12. The apparatus of claim 11, wherein each of the first sockets comprises:
    a base mounted on a corresponding first mount region of the first mount regions to receive the semiconductor package;
    a plurality of socket pins arranged on the base to electrically connect the corresponding first mount region with the semiconductor package;
    a cover arranged over the base;
    at least one spring configured to connect the cover with the base; and a latch configured to fix the semiconductor package together with the spring onto an inner space of the base.

13. The apparatus of claim 11, further comprising:
a plurality of second sockets;
a second extension board attached to a second side surface of each of the two or more test boards,
wherein the first test board further includes a plurality of second mount regions configured to receive the second sockets, and second test lines extended between two adjacent second mount regions of the plurality of second mount regions,
wherein the second extension board is electrically connected to the second test lines, and
wherein the first test lines extend in a first horizontal direction and the second test lines extend in a second horizontal direction different from the first horizontal direction.

14. The apparatus of claim 11, further comprising connectors arranged at the first side surface of the first test board to connect the first extension board to the first test lines.

15. The apparatus of claim 11, further comprising a coupling member configured to selectively connect the first extension board with the test head.

16. An apparatus for testing a signal speed of a semiconductor package, the apparatus comprising:
a plurality of sockets each including a latch configured to fix the semiconductor package;
two or more test boards vertically stacked on each other and including a first test board,
wherein the first test board includes a plurality of mount regions configured to receive the sockets, and test lines extended between two adjacent mount regions of the plurality of mount regions;
connectors arranged at a side surface of the first test board and connected to the first test board to the test lines;
an extension board including a vertically-extending surface,
wherein the vertically-extending surface of the extension board is attached to a side surface of each of the two or more test boards, and
wherein the extension board is electrically connected to the connectors;
a test head electrically connected to the extension board to provide the mount regions with a test signal for testing the signal speed of the semiconductor package through the extension board; and
a coupling member configured to selectively connect the extension board to the test head.

17. The apparatus of claim 16, wherein each of the sockets comprises:
a base mounted on a corresponding mount region of the mount regions to receive the semiconductor package;
a plurality of socket pins arranged on the base to electrically connect the corresponding mount regions to the semiconductor package;
a cover arranged over the base;
at least one spring configured to connect the cover to the base; and
a latch configured to fix the semiconductor package together with the spring in an inner space of the base.

* * * * *